(12) United States Patent
Oikawa et al.

(10) Patent No.: US 11,721,595 B2
(45) Date of Patent: Aug. 8, 2023

(54) PROCESSING METHOD AND PLASMA PROCESSING APPARATUS

(71) Applicant: Tokyo Electron Limited, Tokyo (JP)

(72) Inventors: Sho Oikawa, Miyagi (JP); Seiji Yokoyama, Miyagi (JP); Taichi Okano, Miyagi (JP); Shunichi Kawasaki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 606 days.

(21) Appl. No.: 16/737,168

(22) Filed: Jan. 8, 2020

(65) Prior Publication Data

US 2020/0227326 A1 Jul. 16, 2020

(30) Foreign Application Priority Data

Jan. 11, 2019 (JP) .................................. 2019-003760
Jan. 7, 2020 (JP) .................................. 2020-000944

(51) Int. Cl.
*H01L 21/02* (2006.01)
*H01J 37/32* (2006.01)
*C23C 16/52* (2006.01)
*H01L 21/66* (2006.01)
*C23C 14/34* (2006.01)
*C23C 16/503* (2006.01)
*C23C 14/54* (2006.01)

(52) U.S. Cl.
CPC .............. *H01L 22/20* (2013.01); *C23C 14/34* (2013.01); *C23C 14/54* (2013.01); *C23C 16/503* (2013.01); *C23C 16/52* (2013.01); *H01J 37/32642* (2013.01); *H01J 37/32715* (2013.01); *H01J 37/32926* (2013.01); *H01L 21/02274* (2013.01); *H01J 2237/332* (2013.01); *H01J 2237/334* (2013.01); *H01J 2237/3321* (2013.01)

(58) Field of Classification Search
None
See application file for complete search history.

(56) References Cited

U.S. PATENT DOCUMENTS 5,685,914 A * 11/1997 Hills ................. H01J 37/32449
156/915
9,852,889 B1 12/2017 Kellogg et al.
(Continued)

FOREIGN PATENT DOCUMENTS

JP 2007-258417 10/2007
JP 2015-173240 10/2015

*Primary Examiner* — Shamim Ahmed
(74) *Attorney, Agent, or Firm* — IPUSA, PLLC (57) ABSTRACT

A method of processing an object using a plasma processing apparatus is provided. The plasma processing apparatus includes a stage on which the object is placed in a chamber, an outer peripheral member disposed around the stage, and a first power supply configured to apply voltage to the outer peripheral member. The method includes a step of exposing the object to a plasma containing a precursor having a deposition property, while applying voltage from the first power supply to the outer peripheral member. In applying voltage to the outer peripheral member, a status of a deposition film containing carbon that is deposited on the outer peripheral member is monitored, and the voltage applied to the outer peripheral member is controlled based on the monitored status of the deposition film.

8 Claims, 9 Drawing Sheets

(56) References Cited

U.S. PATENT DOCUMENTS

| | | | |
|---|---|---|---|
| 11,211,229 B2* | 12/2021 | Oikawa | H01L 22/20 |
| 2005/0230049 A1* | 10/2005 | Nishio | H01J 37/32642 |
| | | | 216/61 |
| 2007/0224709 A1 | 9/2007 | Ogasawara | |
| 2016/0351404 A1* | 12/2016 | Aramaki | H01J 37/32715 |
| 2020/0144034 A1* | 5/2020 | Yokoyama | H01J 37/32577 |

* cited by examiner

PROCESSING METHOD AND PLASMA PROCESSING APPARATUS

CROSS-REFERENCE TO RELATED APPLICATIONS

This patent application is based on and claims priority to Japanese Patent Application No. 2019-003760 filed on Jan. 11, 2019, and Japanese Patent Application No. 2020-000944 filed on Jan. 7, 2020, the entire contents of which are incorporated herein by reference.

TECHNICAL FIELD

The present disclosure relates to a processing method and a plasma processing apparatus.

BACKGROUND

In plasma processing, there is a step of depositing a byproduct generated by plasma treatment on a wafer to form a deposited film. For example, Patent Document 1 proposes a technique of repeating the following steps (a) and (b) alternately. The step (a) includes etching a region formed of silicon oxide and forming deposits containing fluorocarbon on the region. The step (b) includes etching the region with radicals of the fluorocarbon contained in the deposit. The byproduct (deposits) are deposited on the wafer as well as on an outer peripheral member (also referred to as an "edge ring") provided around the wafer.

CITATION LIST

Patent Document

[Patent Document 1] Japanese Laid-open Patent Application Publication No. 2015-173240

SUMMARY

The present disclosure provides a technique for removing deposits on an outer peripheral member while suppressing abrasion of the outer peripheral member.

According to one aspect of the present disclosure, a method of processing an object using a plasma processing apparatus is provided. The plasma processing apparatus includes a stage on which the object is placed in a chamber, an outer peripheral member disposed around the stage, and a first power supply configured to apply voltage to the outer peripheral member. The method includes a step of exposing the object to a plasma containing a precursor having a deposition property, while applying voltage from the first power supply to the outer peripheral member. In applying voltage to the outer peripheral member, a status of a deposition film containing carbon that is deposited on the outer peripheral member is monitored, and the voltage applied to the outer peripheral member is controlled based on the monitored status of the deposition film.

BRIEF DESCRIPTION OF THE DRAWINGS

FIG. 1 is a cross-sectional view illustrating an example of a plasma processing apparatus according to an embodiment.

DETAILED DESCRIPTION OF EMBODIMENTS

In the following, embodiments of the present invention will be described with reference to the drawings. Note that in the following drawings, elements having substantially identical features are given the same reference symbols and overlapping descriptions may be omitted.

[Plasma Processing Apparatus]

A plasma processing apparatus 1 according to an embodiment will be described with reference to FIG. 1. FIG. 1 is a cross-sectional view illustrating an example of the plasma processing apparatus 1 according to the present embodiment. The plasma processing apparatus 1 according to the present embodiment is a capacitively coupled parallel plate processing apparatus, and includes a chamber 10. The chamber 10 is a cylindrical container made of aluminum whose surface is anodized for example. The chamber 10 is grounded.

A cylindrical support 14 is disposed at a bottom of the chamber 10 via an insulating plate 12 that is made of ceramic or the like, and a stage 16, for example, is provided on the support 14. The stage 16 includes an electrostatic chuck 20 and a base 16a, and a wafer W is placed on an upper surface of the electrostatic chuck 20. Around the wafer W, an annular edge ring 24 made of silicon for example is provided. The edge ring 24 may also be referred to as a focus ring. The edge ring 24 is an example of an outer peripheral member disposed around the stage 16. Around the base 16a and the support 14, an annular insulator ring 26 made of quartz for example is provided. Inside the electrostatic chuck 20, a first electrode 20a of a conductive film is embedded in an insulating layer 20b at a central portion of the electrostatic chuck 20. The first electrode 20a is connected to a power supply 22. Direct current (DC) voltage applied from the power supply 22 to the first electrode 20a generates electrostatic force that attracts the wafer W to the surface of the electrostatic chuck 20 on which the wafer W is placed. The electrostatic chuck 20 may include a heater to control temperature.

Inside the support 14, a coolant chamber 28 is formed, for example, in the form of a ring or a spiral. Coolant at a predetermined temperature supplied from a chiller unit (not illustrated), such as cooling water, passes through a pipe 30a, the coolant chamber 28, and a pipe 30b, and is returned to the chiller unit. By circulating the coolant through the above-described path, a temperature of the wafer W can be controlled by the temperature of the coolant. In addition, heat transfer gas such as He gas, which is supplied from a heat transfer gas supply mechanism, is supplied through a gas supply line 32 to a gap between the upper surface of the electrostatic chuck 20 and a bottom surface of the wafer W. This heat transfer gas reduces a heat transfer coefficient between the upper surface of the electrostatic chuck 20 and the bottom surface of the wafer W, and makes temperature control of the wafer W by the temperature of the coolant more effective. In addition, in a case in which the electrostatic chuck 20 includes a heater, heating by the heater and cooling by the coolant enable high responsiveness and high precision control of the temperature of the wafer W.

An upper electrode 34 is provided on a ceiling of the chamber 10 so as to face the stage 16. Between the upper electrode 34 and the stage 16 is a plasma processing space. The upper electrode 34 occludes an aperture of the ceiling of the chamber 10 via an insulating shielding member 42. The upper electrode 34 includes an electrode plate 36 and an electrode support 38. The electrode plate 36 includes a large number of gas discharge holes 37 on a surface facing the stage 16, and is formed of a silicon-containing material such as silicon or SiC. The electrode support 38 detachably supports the electrode plate 36, and is formed of a conductive material, such as aluminum whose surface is anodized. Inside the electrode support 38, a large number of gas flow holes 41a and 41b extend downwardly from gas diffusion chambers 40a and 40b respectively, and the gas flow holes 41a and 41b communicate with the gas discharge holes 37.

A gas inlet 62 is connected to a process gas source 66 via a gas supply line 64. The gas supply line 64 is provided with a mass flow controller (MFC) 68 and an open/close valve 70 from an upstream side in which the process gas source 66 is provided. A process gas is supplied from the process gas source 66, and a gas flow is controlled by the mass flow controller 68 and the open/close valve 70. The process gas supplied from the process gas source 66 passes through the gas supply line 64, and is discharged in a shower-like manner from the gas discharge holes 37, through the gas diffusion chamber 40a and the gas flow holes 41a (or through the gas diffusion chamber 40b and the gas flow holes 41b).

The plasma processing apparatus 1 includes a first radio frequency power supply 90 and a second radio frequency power supply 48. The first radio frequency power supply 90 is a power source that generates first radio frequency power (hereinafter referred to as "HF power"). The first radio frequency power has a frequency suitable for generating a plasma. The frequency of the first radio frequency power is, for example, within a range from 27 MHz to 100 MHz. The first radio frequency power supply 90 is connected to the base 16a via a matching device 88 and a power supply line 89. The matching device 88 includes circuitry for causing output impedance of the first radio frequency power supply 90 to match impedance of a load (base 16a side). The first radio frequency power supply 90 may be connected to the upper electrode 34 via the matching device 88.

The second radio frequency power supply 48 is a power source that generates second radio frequency power (hereinafter referred to as "LF power"). The second radio frequency power has a frequency lower than the frequency of the first radio frequency power. In a case in which the second radio frequency power is used in conjunction with the first radio frequency power, the second radio frequency power is used as radio frequency power for attracting ions into the wafer W. The frequency of the second radio frequency power is, for example, within a range from 400 kHz to 13.56 MHz. The second radio frequency power supply 48 is connected to the base 16a via a matching device 46 and a power supply line 47. The matching device 46 includes circuitry for causing output impedance of second radio frequency power supply 48 to match impedance of the load (base 16a side).

It should be noted that a plasma may be generated using the second radio frequency power without using the first radio frequency power. That is, a plasma may be generated by using only a single type of radio frequency power. In such a case, a frequency of the second radio frequency power may be greater than 13.56 MHz, for example 40 MHz. The plasma processing apparatus 1 may not include the first radio frequency power supply 90 and the matching device 88. According to this configuration, the stage 16 also functions as a lower electrode. The upper electrode 34 also functions as a showerhead for supplying gas.

A second variable power supply 50 is connected to the upper electrode 34, and applies DC voltage to the upper electrode 34. A first variable power supply 55 is connected to the edge ring 24, and applies DC voltage to the edge ring 24. The first variable power supply 55 is an example of a first power supply that applies voltage to the outer peripheral member. The second variable power supply 50 is an example of a second power supply that applies voltage to the upper electrode 34.

An exhaust device 84 is connected to an exhaust pipe 82. The exhaust device 84 includes a vacuum pump such as a turbomolecular pump, which performs evacuation from an exhaust port 80 formed at the bottom of the chamber 10 through the exhaust pipe 82, to reduce pressure in the chamber 10 to a desired quality of vacuum. The exhaust device 84 also controls pressure in the chamber 10 to be constant, by observing magnitude of pressure in the chamber 10 using a pressure gauge (not illustrated) that measures pressure in the chamber 10. An inlet/outlet port 85 is provided on a side wall of the chamber 10. The wafer W is loaded and unloaded from the inlet/outlet port 85, by opening and closing a gate valve 86.

A baffle plate 83 is annularly provided between the insulator ring 26 and the side wall of the chamber 10. The baffle plate 83 has multiple through-holes. The baffle plate 83 is formed of aluminum and has a surface coated with ceramic such as $Y_2O_3$.

When a predetermined plasma process, such as a plasma etching process, is performed in the plasma processing apparatus 1 according to the above-described configuration, the gate valve 86 is opened, the wafer W is loaded into the chamber 10 via the inlet/outlet port 85 to place the wafer W on the stage 16, and the gate valve 86 is closed. A process gas is supplied to the interior of the chamber 10, and the chamber 10 is evacuated by the exhaust device 84.

The first radio frequency power and the second radio frequency power are applied to the stage 16. DC voltage is applied from the power supply 22 to the first electrode 20a to cause the wafer W to be attracted to the stage 16. The DC voltage may be applied from the second variable power supply 50 to the upper electrode 34.

The plasma process such as etching is applied to a surface to be processed of the wafer W, by means of radicals or ions in the plasma generated in the plasma processing space.

The plasma processing apparatus 1 includes a controller 200 for controlling an entire operation of the plasma processing apparatus 1. A processor (CPU) provided in the controller 200 performs a desired plasma process such as etching, according to a recipe stored in a memory, such as a ROM or a RAM. The recipe may include process time, pressure (gas exhaust), first and second radio frequency power, voltage, and various gas flow rates, which are control information of the plasma processing apparatus 1 corresponding to a process condition. The recipe may also include a temperature in the chamber (upper electrode temperature, chamber sidewall temperature, wafer W temperature, electrostatic chuck temperature, etc.), a coolant temperature output from the chiller, and the like. Programs and the recipe representing the aforementioned process conditions may be stored in a hard disk drive or a semiconductor memory. The recipe may also be stored in a portable computer-readable recording medium such as a CD-ROM or a DVD, and the computer-readable recording medium may be set to a predetermined position in an accessible state.

[Deposition and Ion Bombardment Steps]

In recent years, in the art such as ALE (Atomic Layer Etching), in which an etching process using a gas having a deposition property and an etching process using a gas not having a deposition property are repeated a predetermined number of times, control of a deposition amount has become important. In particular, in cryogenic etching, in which etching is performed by controlling a temperature of the stage 16 within, for example, a subzero temperature range of approximately −200° C. to −10° C., a deposition amount of byproducts produced by the etching increases. Thus, in the cryogenic etching, it is more important to control a deposition amount of byproducts to be deposited on the wafer.

Figure 2A:
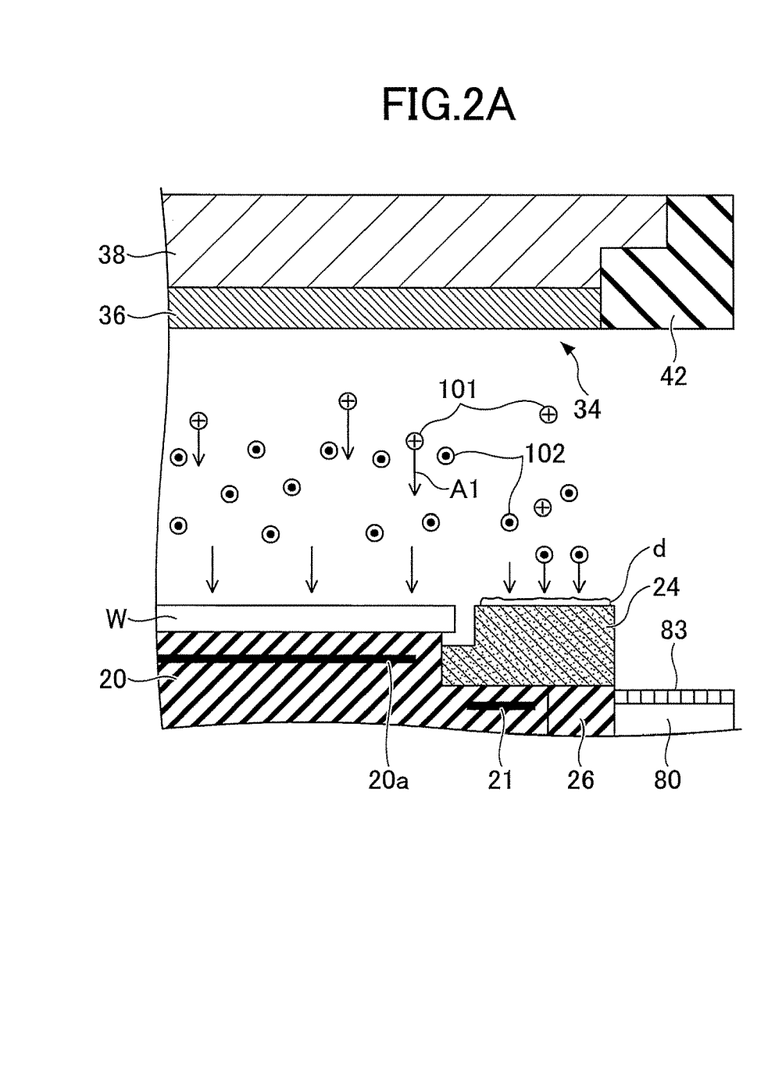
FIGS. 2A and 2B are diagrams illustrating a deposition step and an ion bombardment step.
Figure 2B:
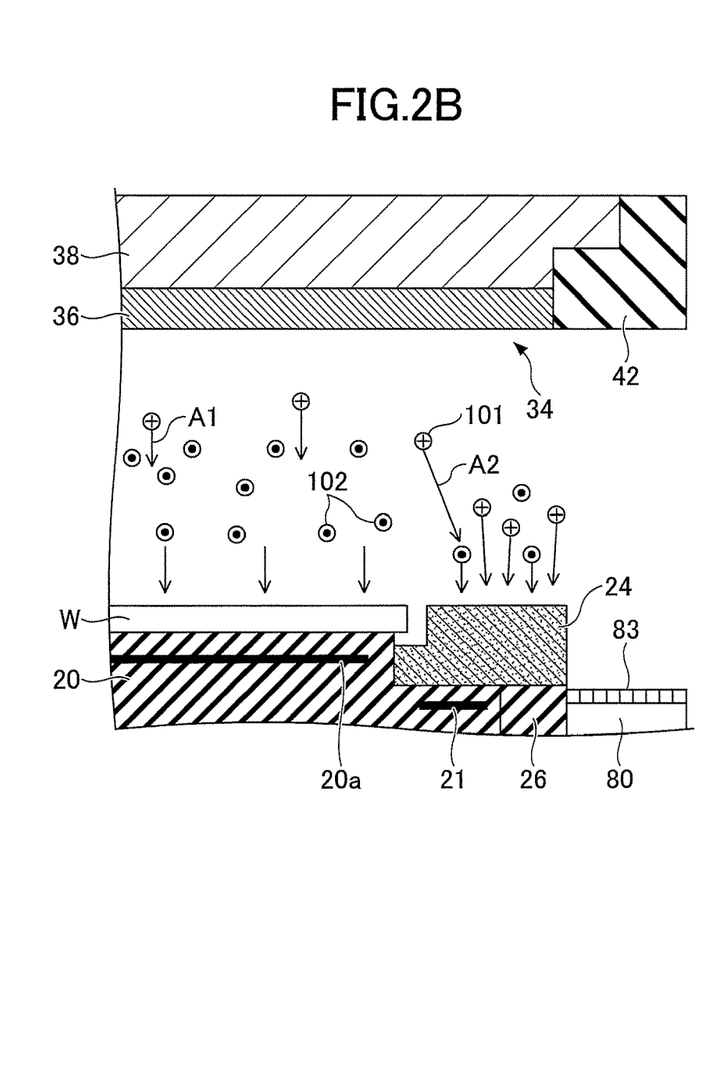

Hereinafter, a step of depositing a byproduct by an etching process (may also be referred to as a "deposition step") and a step of bombarding the edge ring with ions while depositing a byproduct (may also be referred to as an "ion bombardment step") will be described with reference to FIGS. 2A and 2B. FIGS. 2A and 2B are diagrams illustrating a deposition step and an ion bombardment step.

An exemplary deposition step includes etching a region formed of silicon oxide on a wafer W and depositing a carbon-containing deposit on the region. In this deposition step, the process gas source 66 supplies a carbon-containing process gas, such as a fluorocarbon gas (e.g. like $C_4F_8$) or a hydrocarbon gas (e.g. $CH_4$). The process gas may also be a hydrofluorocarbon gas such as $CH_2F_2$. The process gas may include an inert gas. Hereinafter, a case in which argon gas is included as an inert gas will be described.

The process gas becomes a plasma by the first radio frequency power and the second radio frequency power. For example, the plasma includes radicals 102 and ions 101, as illustrated in FIGS. 2A and 2B. Examples of the radical 102 include $CH_x$ radical ($CH_x^*$) and $C_yF_z$ radical ($C_yF_z^*$), and an example of the ion 101 includes argon ion ($Ar^+$) 101.

Here, FIG. 2A illustrates a case in which DC voltage is not applied to the edge ring 24, and FIG. 2B illustrates a case in which DC voltage is applied to the edge ring 24. Argon ions 101 are anisotropic, and in FIG. 2A, the argon ions 101 move toward the stage 16 to which the second radio frequency power is applied, as indicated by an arrow A1, contributing to etching of the silicon oxide on the wafer W. The radicals 102 act isotropically on the wafer W. Thus, carbon-containing byproducts generated during the etching process are deposited on the wafer W. During processing, the edge ring 24 is exposed to a plasma. Thus, carbon-containing byproducts are deposited not only on the wafer W but also on the edge ring 24 (d in FIG. 2A).

In a case in which an etching process using a gas having a deposition property and an etching process using a gas not having a deposition property are performed sequentially or alternately while carbon-containing byproducts are deposited on the edge ring 24, the plasma is biased due to an effect of the byproducts (deposits) on the edge ring 24, and etching may not be performed properly. Then, by applying DC voltage from the first variable power supply 55 to the edge ring 24, the argon ions 101 in the plasma are caused to be attracted to the edge ring 24 so that the edge ring 24 is bombarded with the argon ions 101, as indicated by an arrow A2 in FIG. 2B. This causes carbon-containing byproducts deposited on the edge ring 24 to be removed from the edge ring 24.

However, if DC voltage is applied to the edge ring 24 continuously, the edge ring 24 wears out earlier than in a case of not applying DC voltage. When the edge ring 24 is new, the upper surface of the edge ring 24 and the upper surface of the wafer W are of the same height. In contrast, when the edge ring 24 is abraded, the edge ring 24 becomes thinner and the upper surface of the edge ring 24 is lower than the upper surface of the wafer W. This results in generation of a step between a sheath above the edge ring 24 and a sheath above the wafer W.

Due to this step, as incident angles of ions become inclined at the edge of the wafer W, tilting occurs in which a shape of a recess formed on the wafer W becomes inclined. Therefore, it is desirable to suppress abrasion of the edge ring 24 so as not to cause tilting. Also, it is desirable to remove deposits on the edge ring 24. The plasma processing apparatus 1 according to the present embodiment provides a processing method for removing deposits on the edge ring 24 while suppressing abrasion of the edge ring 24. In order to realize the processing method, a deposition status of byproducts (hereinafter referred to as "deposits" or "deposition film") on the edge ring 24 that are generated and deposited during an etching process is monitored, and application of DC voltage to the edge ring 24 is controlled in accordance with the deposition status. An example of the deposition status is a deposition amount of deposits. However, the deposition status may be a thickness of deposits or coverage of deposits on the edge ring 24.

[Monitoring Deposition Status]

Figure 3A:
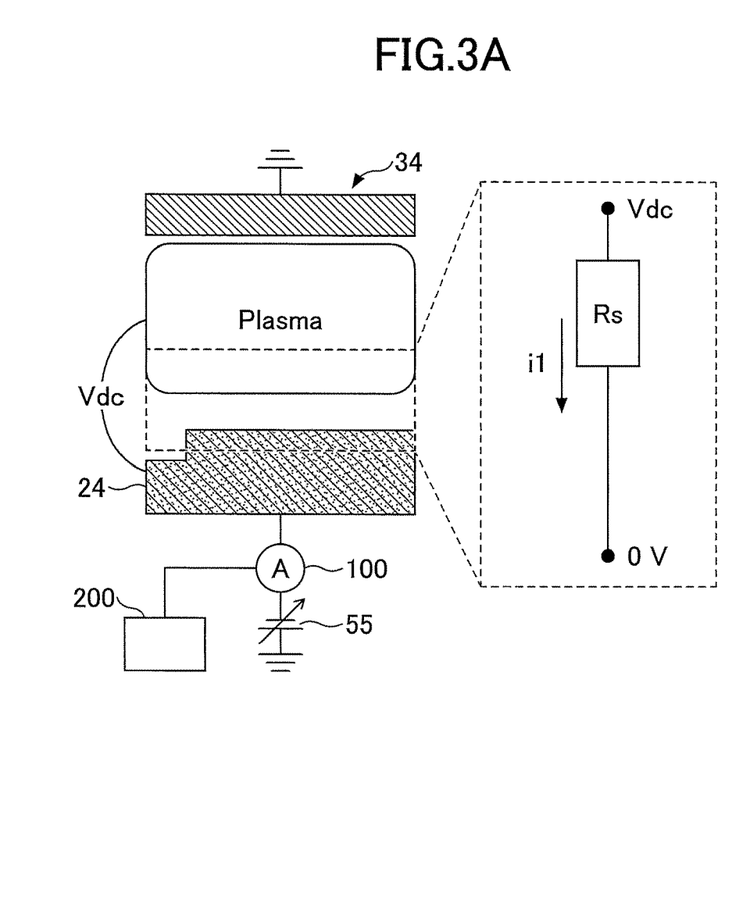
FIGS. 3A and 3B are diagrams illustrating an example of a method of monitoring a deposition status on an edge ring.
Figure 3B:
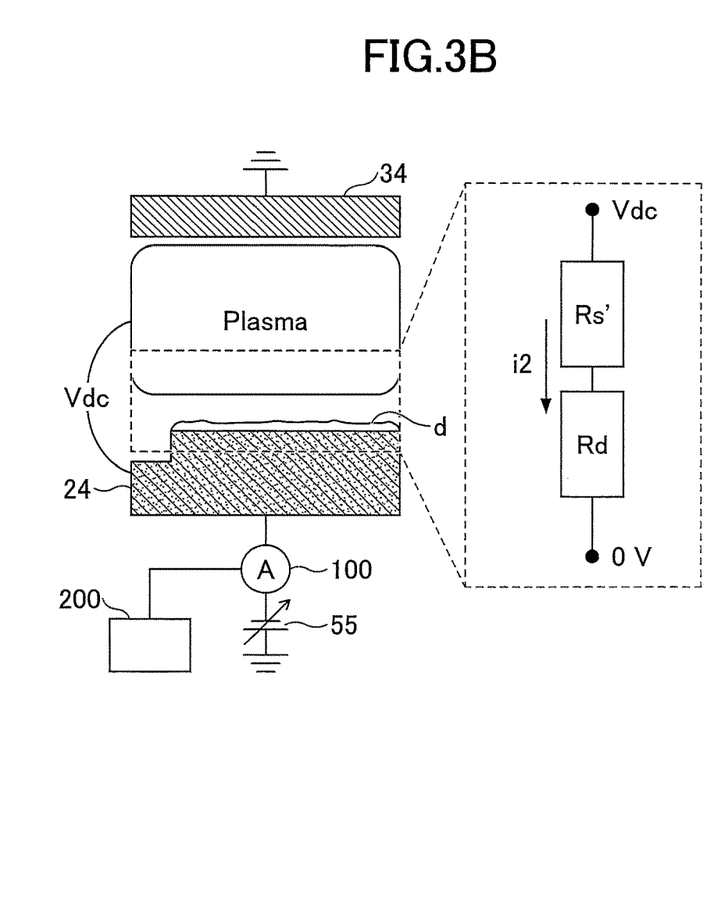

Next, a method of monitoring a thickness of deposits on the edge ring 24 will be described with reference to FIGS. 3A and 3B. FIGS. 3A and 3B are diagrams illustrating an example of a monitoring method of a deposition status on the edge ring. In the present monitoring method, an ammeter 100 is connected to a power supply line connecting the first variable power supply 55 and an edge ring 24. When predetermined DC voltage Vdc is applied from the first variable power supply 55, a potential difference Vdc occurs in a plasma sheath between the edge ring 24 and the plasma. Because of the potential difference Vdc, ions are drawn into the edge ring 24, and current (denoted by "i" in the present embodiment) of a magnitude, corresponding to an amount of ions drawn into the edge ring 24, flows through the power supply line (e.g. ammeter 100). The ammeter 100 measures magnitude of the current (i) caused by the potential difference Vdc.

As illustrated in FIG. 3A, in a case in which no deposits are present on the edge ring 24, magnitude of current (may also be referred to as a current value) i1 flowing through the ammeter 100 when DC voltage is applied from the first variable power supply 55 to the edge ring 24 is expressed by the following formula (1):

$$i1 = Vdc/Rs \qquad (1)$$

where Rs is resistance of the plasma sheath and the edge ring 24.

In contrast, as illustrated in FIG. 3B, in a case in which deposits d are present on the edge ring 24, resistance of a path (such as the power supply line or the ammeter 100) of the current i will be a sum of resistance of the deposits d (denoted by Rd) and the resistance of the plasma sheath and the edge ring 24 (denoted by Rs' in FIG. 3B). Accordingly, a current value i2 flowing through the ammeter 100 when DC voltage Vdc is applied to the edge ring 24 is expressed by the following formula (2):

$$i2=Vdc/(Rs'+Rd) \qquad (2).$$

Because the resistance of the deposit d (Rd) is sufficiently larger than Rs' (i.e. Rd>>Rs'), i2 is expected to be significantly smaller than i1 from the formulas (1) and (2). That is, if deposits are deposited on the edge ring 24, magnitude of the current i is expected to decrease. Therefore, by collecting correlation data between a deposition amount on the edge ring 24 and magnitude of the current i, and by storing the correlation data into memory in advance, presence or absence of deposits on the edge ring 24 can be determined by monitoring magnitude of the current i during plasma processing.

Figure 4:
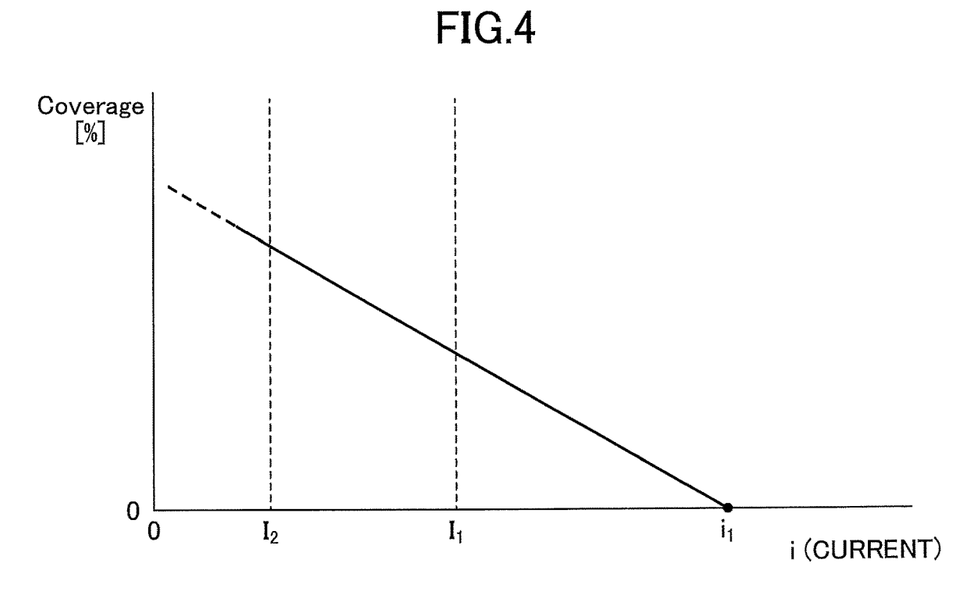
FIG. 4 is a graph illustrating an example of a relationship between a monitored value and the deposition status on the edge ring according to the embodiment.

For example, the correlation data between coverage of deposits on the edge ring 24 and magnitude of the current i may be prepared, as illustrated in a graph of FIG. 4, by monitoring the current i and the coverage in advance. This allows timing of applying voltage to the edge ring 24 to be determined based on the magnitude of the current i.

$I_1$ and $I_2$ illustrated in FIG. 4 are thresholds for determining timing when the edge ring 24 should be bombarded with ions. The thresholds $I_1$ and $I_2$ ($I_1>I_2$) are preset in advance. However, only one of the threshold $I_1$ and the threshold $I_2$ may be preset. For example, when magnitude of the current (current value) i becomes less than or equal to the threshold $I_1$, it may be determined that the coverage of the deposits on the edge ring 24 becomes greater than or equal to a predetermined level, and application of DC voltage to the edge ring may be initiated. In this case, when the current value i becomes greater than the threshold $I_1$, it may be determined that the coverage of the deposits on the edge ring 24 becomes less than the predetermined level, and the application of the DC voltage to the edge ring 24 may be stopped.

DC voltage applied to the edge ring 24 is not limited to a binary of "on" and "off". For example, DC voltage applied to the edge ring may be controlled to be off, low, and high. For example, magnitude of DC voltage to be applied to the edge ring 24 may be changed from off to low when the current value i becomes less than or equal to the threshold $I_1$. Further, when the current value i becomes less than or equal to the threshold $I_2$, DC voltage to be applied to the edge ring 24 may be set to high. When the current value i is greater than the threshold $I_1$, application of DC voltage to the edge ring 24 may be stopped.

A method of monitoring an amount of deposits on the edge ring 24 is not limited to the method illustrated in FIG. 3A or 3B. For example, a thickness of deposits on the edge ring 24 can be determined by illuminating the edge ring 24 with light and monitoring reflected light. Alternatively, other known techniques may be used to monitor a status of deposits.

[Voltage Application Control Step]

Figure 5:
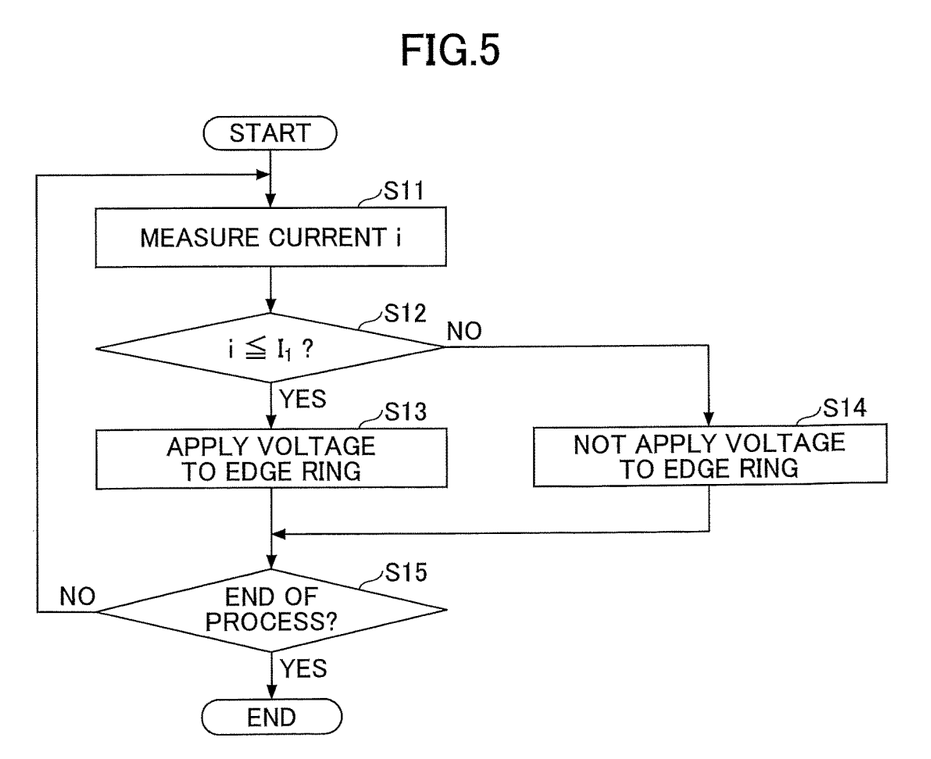
FIG. 5 is a flowchart illustrating an example of a voltage application control step according to the embodiment.

Next, a process of applying voltage to the edge ring (hereinafter referred to as a "voltage application control step") according to the present embodiment will be described with reference to FIG. 5. FIG. 5 is a flowchart illustrating an example of the voltage application control step. This process is controlled by the controller 200. A program that causes the controller 200 to execute the voltage application control step is stored in the memory of the controller 200. By the program being loaded from the memory by the CPU and being executed by the CPU, the voltage application control step is executed by the controller 200.

The voltage application control step is performed while a plasma of a process gas containing carbon is generated in the plasma processing apparatus 1 and the wafer W and the edge ring 24 are exposed to the plasma of the process gas.

When the process (voltage application control step) is started, the controller 200 measures the current value i by acquiring a measured value of the current i from the ammeter 100 connected to the first variable power supply 55 (step S11). Next, in step S12, the controller 200 determines whether or not the current value i is less than or equal to a predetermined threshold $I_1$.

If the current value i is less than or equal to the predetermined threshold $I_1$, the controller 200 causes the first variable power supply 55 to apply DC voltage to the edge ring 24 (step S13). Meanwhile, if the current value i is greater than the predetermined threshold $I_1$, the controller 200 does not cause the first variable power supply 55 to apply DC voltage to the edge ring 24 (step S14). In other words, in step S14, the controller 200 sets DC voltage applied to the edge ring 24 to zero.

Next, in step S15, the controller 200 determines whether or not to terminate the process. If it is determined not to terminate the process, the process reverts to step S11. The process is executed repeatedly until it is determined to terminate the process.

Figure 6A:
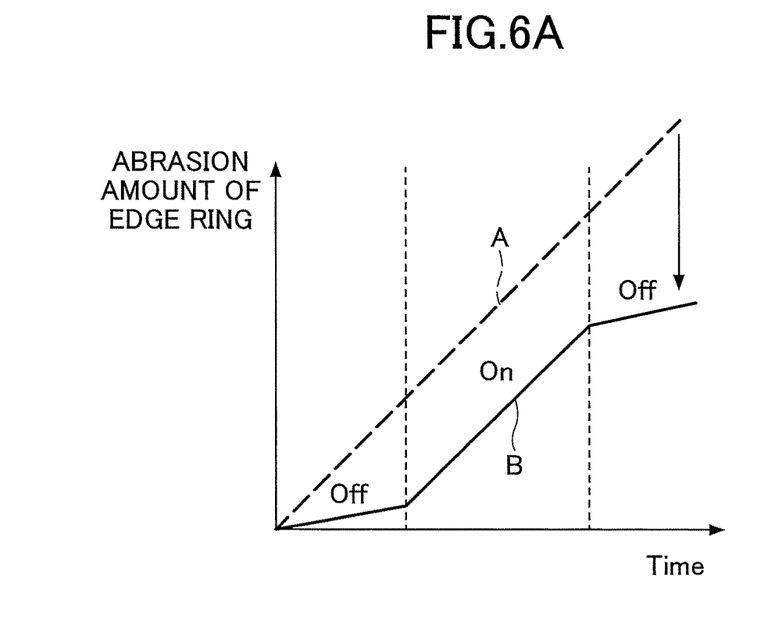
FIGS. 6A and 6B are diagrams illustrating an effect of the voltage application control step according to the embodiment.
Figure 6B:
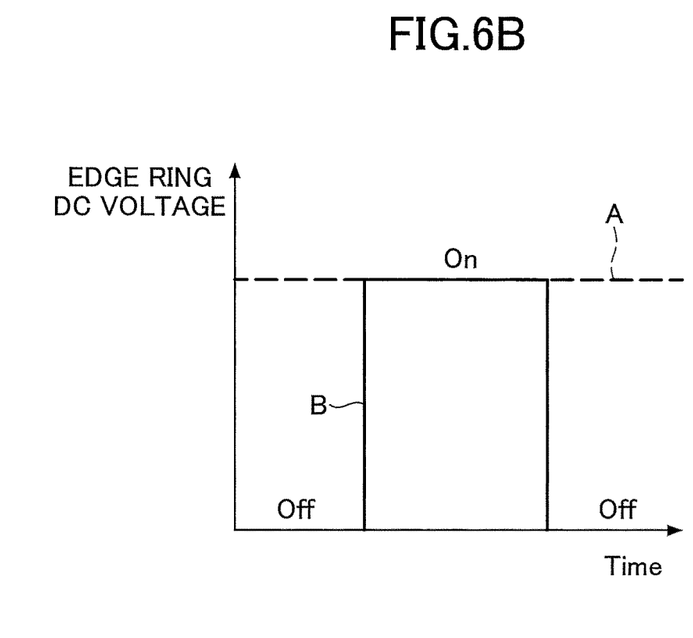

FIGS. 6A and 6B are diagrams illustrating an example of an effect of the voltage application control described above. The horizontal axis of FIG. 6A indicates the time of application of DC voltage to the edge ring 24, and the vertical axis indicates an amount of abrasion of the edge ring 24.

A dashed line A in FIG. 6A illustrates an example of an amount of abrasion of the edge ring 24 when DC voltage is applied to the edge ring 24 continuously. In this case, the edge ring 24 is abraded in accordance with the time of application of DC voltage to the edge ring 24.

In contrast, a solid line B in FIG. 6A illustrates an example of an amount of abrasion of the edge ring 24 when DC voltage is applied intermittently to the edge ring 24 by the voltage application control step according to the present embodiment, as illustrated in FIG. 6B (line B). In this case, because DC voltage is applied to the edge ring 24 discontinuously, the amount of abrasion of the edge ring 24 can be reduced compared to a case of the line A, in which DC voltage is applied continuously. By performing the voltage application control step, abrasion of the edge ring 24 can be minimized.

[Etch Rate Variation]

As described above, it has been found that abrasion of the edge ring 24 can be reduced by applying DC voltage to the edge ring 24 intermittently. However, applying DC voltage to the edge ring 24 affects a process characteristic of the wafer W.

Figure 7:
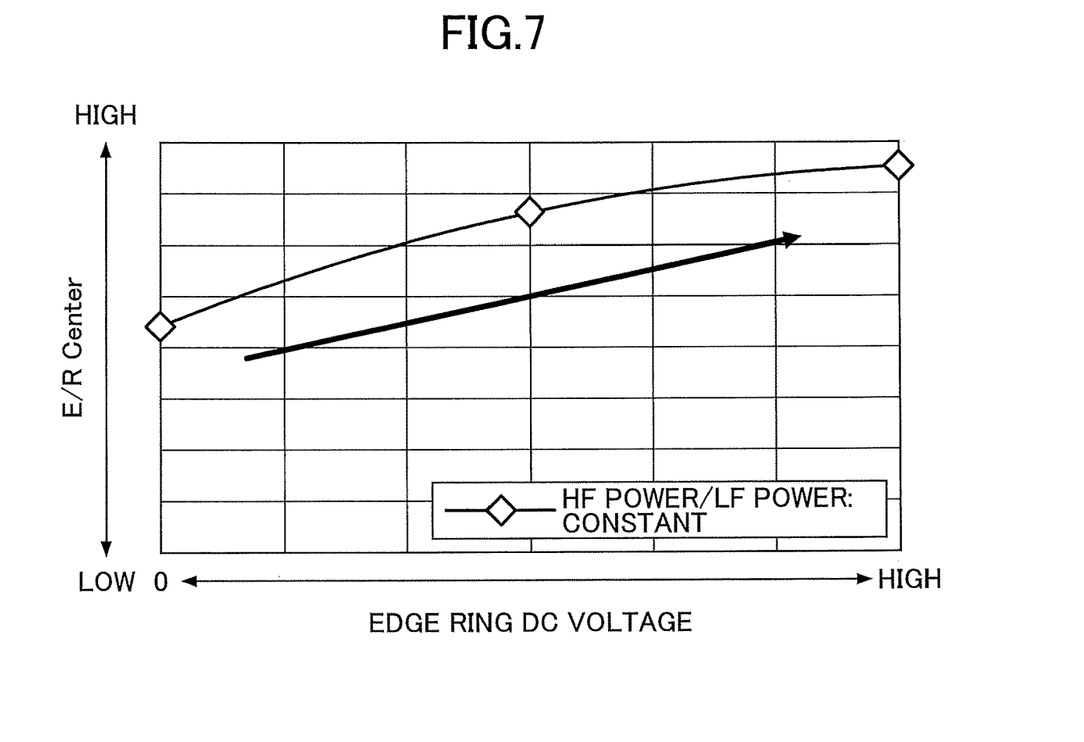
FIG. 7 is a graph illustrating an example of a relationship between an etch rate and voltage applied to the edge ring.

A graph in FIG. 7 illustrates an example of a result of an experiment in which the wafer W is plasma etched while DC voltage is applied to the edge ring 24. Process conditions in this experiment are as follows.

<Process Conditions>

Gas: $CF_4$ gas, $C_4F_8$ gas, $N_2$ gas

HF power: constant

LF power: constant

The horizontal axis of FIG. 7 indicates DC voltage (edge ring DC voltage) applied to the edge ring, and the vertical axis indicates an etch rate (E/R) at the center of the wafer W. According to the result of this experiment, it was found that an etch rate of a central portion of the wafer W increases by applying DC voltage to the edge ring 24. Also, it was found that the etch rate increases as the DC voltage applied to the edge ring 24 increases.

Figure 8:
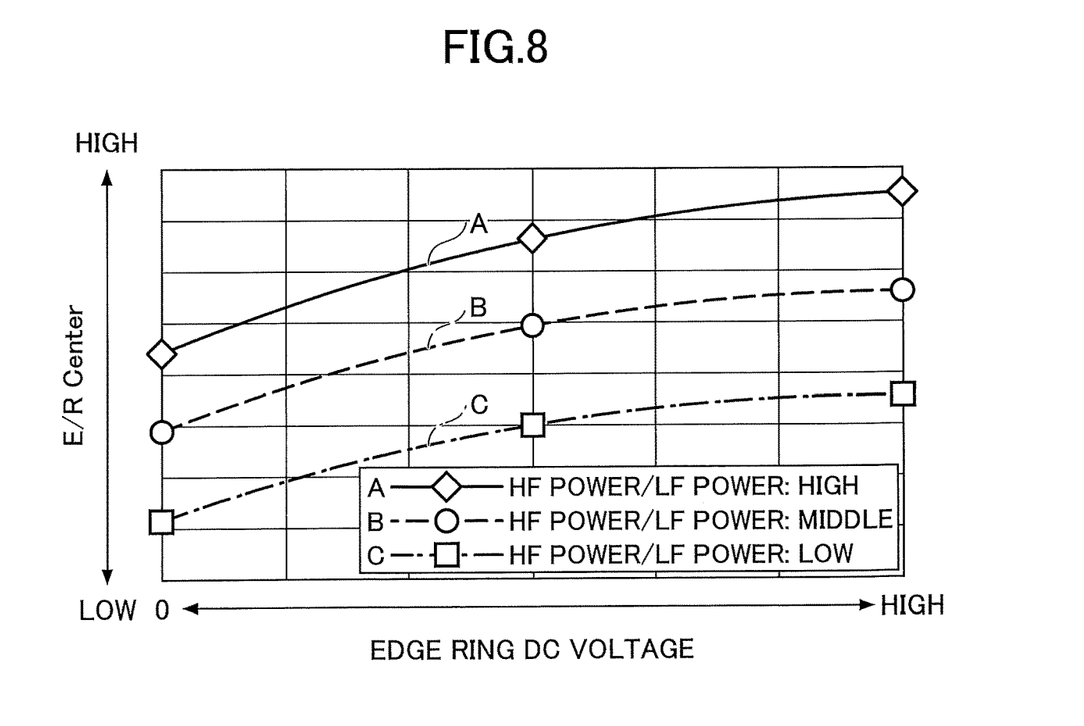
FIG. 8 is a graph illustrating other examples of the relationship between the etch rate and the voltage applied to the edge ring.

In addition, another experiment of observing variation in etch rate was performed, by changing magnitude of HF power and LF power to three levels of magnitude, in addition to changing the edge ring DC voltage. FIG. 8 illustrates the result of this experiment. Process conditions of this experiment are the same as that in FIG. 7, other than HF power and LF power.

A curve B illustrated in FIG. 8 is a result of variation in etch rate when a certain magnitude of HF power and LF power was applied. In the following description, the magnitude of HF power and LF power used for measuring the variation corresponding to the curve B is referred to as "reference power", and is denoted by "middle" in FIG. 8. A curve A is a result of variation in etch rate when HF power and LF power higher than the reference power was applied. A curve C is a result of variation in etch rate when HF power and LF power lower than the reference power was applied.

According to these results, in each of the above-described cases (curve A, curve B, and curve C), trend of variation in etch rate was similar, in which the etch rate increases in accordance with increase in the edge ring DC voltage. In other words, it was found that, by applying DC voltage to the edge ring 24, an etch rate of a central portion of the wafer W increases, and controllability of the etch rate deteriorates.

[Adjusting HF Power and LF Power]

Therefore, based on etch rates (at a central portion of a wafer W) that are measured by changing DC voltage applied to the edge ring 24, HF power, and LF power, an approximation equation representing a relationship between the etch rate, the DC voltage applied to the edge ring 24, the HF power, and the LF power, is obtained. Then, by using the approximation equation, adjustment amounts of the HF power and the LF power, which are required for making the etch rate when DC voltage is applied to the edge ring 24 equal to the etch rate when DC voltage is not applied to the edge ring 24, are estimated.

According to this, a shift (increase) of an etch rate in a center of a wafer W that occurs when DC voltage is applied to the edge ring 24 can be suppressed, by adjusting HF power and LF power applied during plasma processing based on the adjustment amount of the HF power and the adjustment amount of the LF power. This increases in-plane uniformity or controllability of an etch rate, and prevents degradation of process characteristics to a wafer W when voltage is applied to the edge ring 24.

Figure 9A:
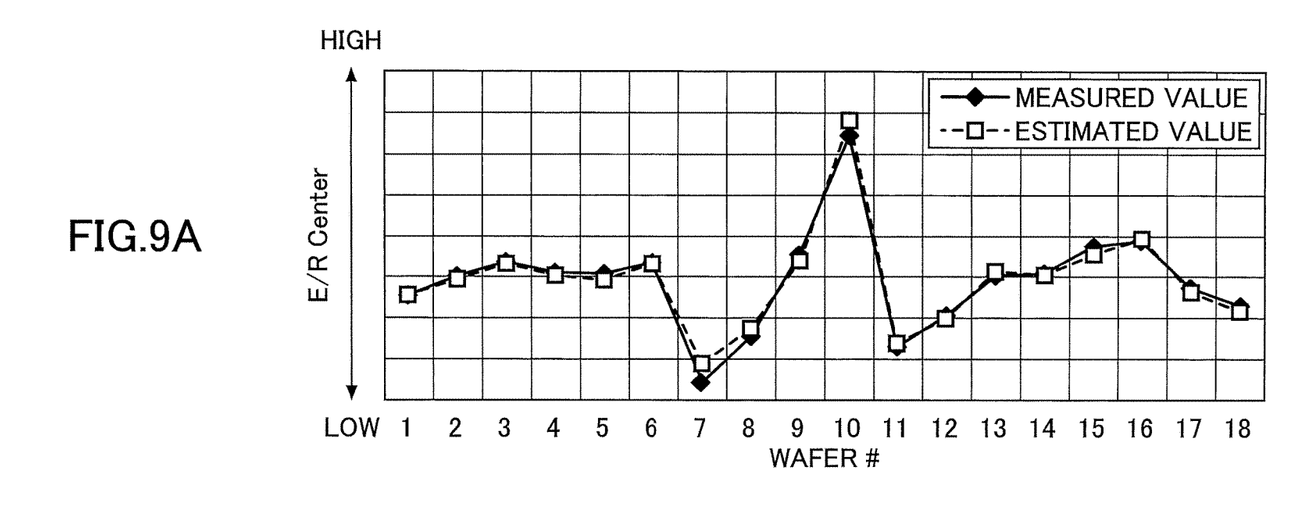
FIG. 9A is a graph illustrating an example of processing results of an etching process.

FIG. 9A illustrates a measurement result of etch rates of central portions of wafers W, which have been etched by changing process parameters for each of the wafers W. This experiment has been made using an experimental design method. The horizontal axis of FIG. 9A indicates a wafer number, and the vertical axis indicates the etch rate of the central portion of the wafer W. A solid line curve labeled as "MEASURED VALUE" in FIG. 9A represents the measurement result of the etch rates.

A dotted line curve labeled as "ESTIMATED VALUE" in FIG. 9A represents a result of calculating (estimating) etch rates of a central portion of a wafer by changing process parameters. In calculating (estimating) the etch rates, an approximation equation representing a relationship between process parameters and an etch rate of a central portion of a wafer was obtained, by using multivariate analysis of the measurement result of the etch rates, and values on the dotted line curve are calculated using the obtained approximation equation. According to this, accuracy of the approximation equation is high because the curve "ESTIMATED VALUE" is almost the same as the curve "MEASURED VALUE".

Figure 9B:
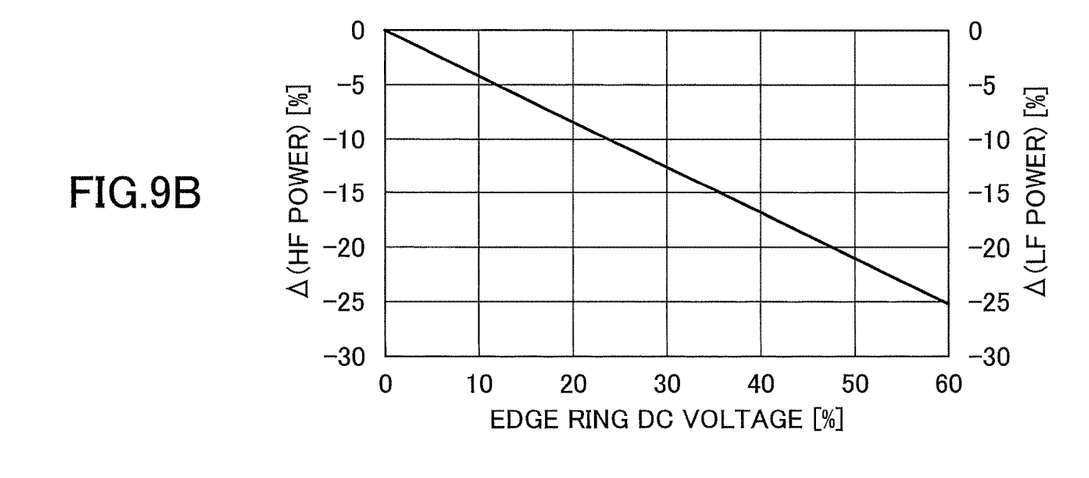
FIG. 9B is a graph illustrating a relationship between the voltage applied to the edge ring, HF power, and LF power.

FIG. 9B represents correlation information obtained by estimating correlation between voltage applied to the edge ring 24 and the adjustment amounts of the HF power and the LF power when an etch rate of a central portion of a wafer W is constant, which is estimated based on the above-described approximation equation.

According to the present embodiment, by adjusting HF power and LF power, an etch rate at a center of a wafer W is not shifted even in a case in which DC voltage is applied to the edge ring 24. Therefore, controllability of the etch rate can be ensured.

Although FIG. 9B illustrates the correlation between voltage applied to the edge ring, HF power, and the LF power when the HF power and the LF power are adjusted by the same ratio, the HF power and the LF power are not required to be adjusted by the same ratio.

[Adjusting Process Parameter]

The approximation equation used may be a linear function, or other functions (such as a quadratic function), if a result obtained by the approximation equation becomes close to an actual measured value. By adjusting HF power and LF power using such an approximation equation, in-plane uniformity of process characteristics of a wafer W can be ensured without changing an etch rate of the central portion of the wafer W.

Adjustment amounts of HF power and LF power that are required for not changing an etch rate of a central portion of a wafer, in a case in which DC voltage at a certain level is applied to the edge ring 24 (or in which DC voltage applied to the edge ring 24 is changed by a certain amount), can be estimated by using the approximation equation. Therefore, correlation information indicating the relationship between DC voltage applied to the edge ring, HF power, and LF power, which is estimated based on the approximation equation, may be stored in the memory of the controller 200 in advance (note that the correlation information may also be referred to as "adjustment information").

For example, in the graph illustrated in FIG. 9B, the horizontal axis indicates a ratio of DC voltage applied to the edge ring 24 to a maximum output value of the first variable power supply 55 (e.g. maximum voltage that can be applied to the edge ring 24), while the vertical axis on the left side indicates an adjustment amount of HF power that is expressed as a ratio (%) of a change amount (decrease amount) of HF power to default HF power that is applied when DC voltage is not applied to the edge ring 24, and the vertical axis on the right side indicates an adjustment amount of LF power that is expressed as a ratio (%) of a change amount (decrease amount) of LF power to default LF power that is applied when DC voltage is not applied to the edge ring 24.

The example of FIG. 9B indicates that, if the DC voltage applied to the edge ring 24 is increased by "30%", the HF power should be reduced by "12.5%" from the default HF power and the LF power should be reduced by "12.5%" from the default LF power. Then, the HF power after adjustment and the LF power after adjustment are applied to the base 16a.

As described above, by adjusting magnitude of HF power and LF power in accordance with DC voltage applied to the edge ring 24 or variation of DC voltage applied to the edge ring 24, increase in etch rate of a central portion of a wafer W can be suppressed even if DC voltage is applied to the edge ring 24. Thus, tilting of an edge portion of the wafer W can be suppressed by applying DC voltage to the edge ring 24, while increasing controllability of the etch rate.

In the present embodiment, HF power and LF power are adjusted according to magnitude of the DC voltage applied to the edge ring 24 or variation of DC voltage applied to the edge ring 24, but process parameters to be adjusted according to the DC voltage applied to the edge ring 24 are not limited to HF power and LF power. Any process parameter in a process condition that affects density of plasma to be generated (e.g. a process parameter that causes plasma density to vary in accordance with change in the process parameter) may be chosen as a process parameter to be adjusted. A process parameter in a process condition to be adjusted may be, for example, a process parameter that affects an etch rate (e.g. a process parameter that causes an etch rate to vary in accordance with change in the process parameter).

For example, a process parameter to be adjusted may be LF power only or HF power only. Process parameters to be adjusted may be DC voltage applied from the second variable power supply 50 to the upper electrode 34, a type of gas supplied from the process gas source 66 and/or a flow rate of the gas, or pressure in the chamber 10.

That is, a process parameter may be at least one of: radio frequency power at a first frequency applied from the first radio frequency power supply 90, radio frequency power at a second frequency lower than the first frequency applied from the second radio frequency power supply 48, gas supplied to the chamber 10, pressure in the chamber 10, and voltage applied from the second variable power supply 50 to the upper electrode 34.

[Processing Method and Adjustment Process]

Figure 10:
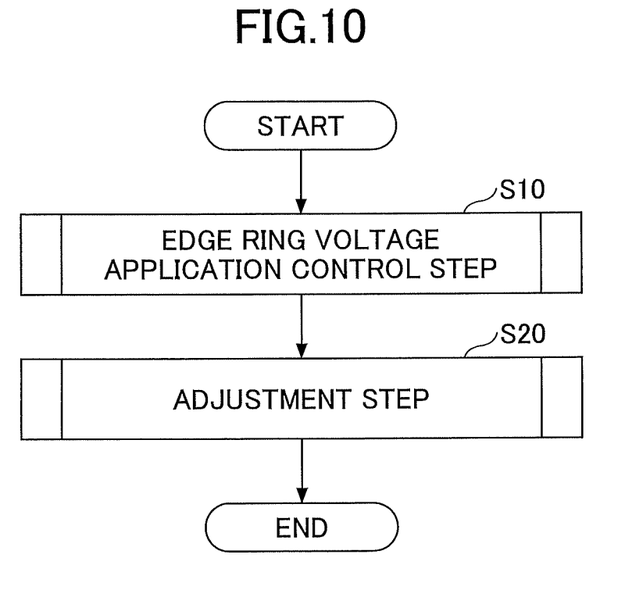
FIG. 10 is a flowchart illustrating an example of the processing method according to the embodiment.
Figure 11:
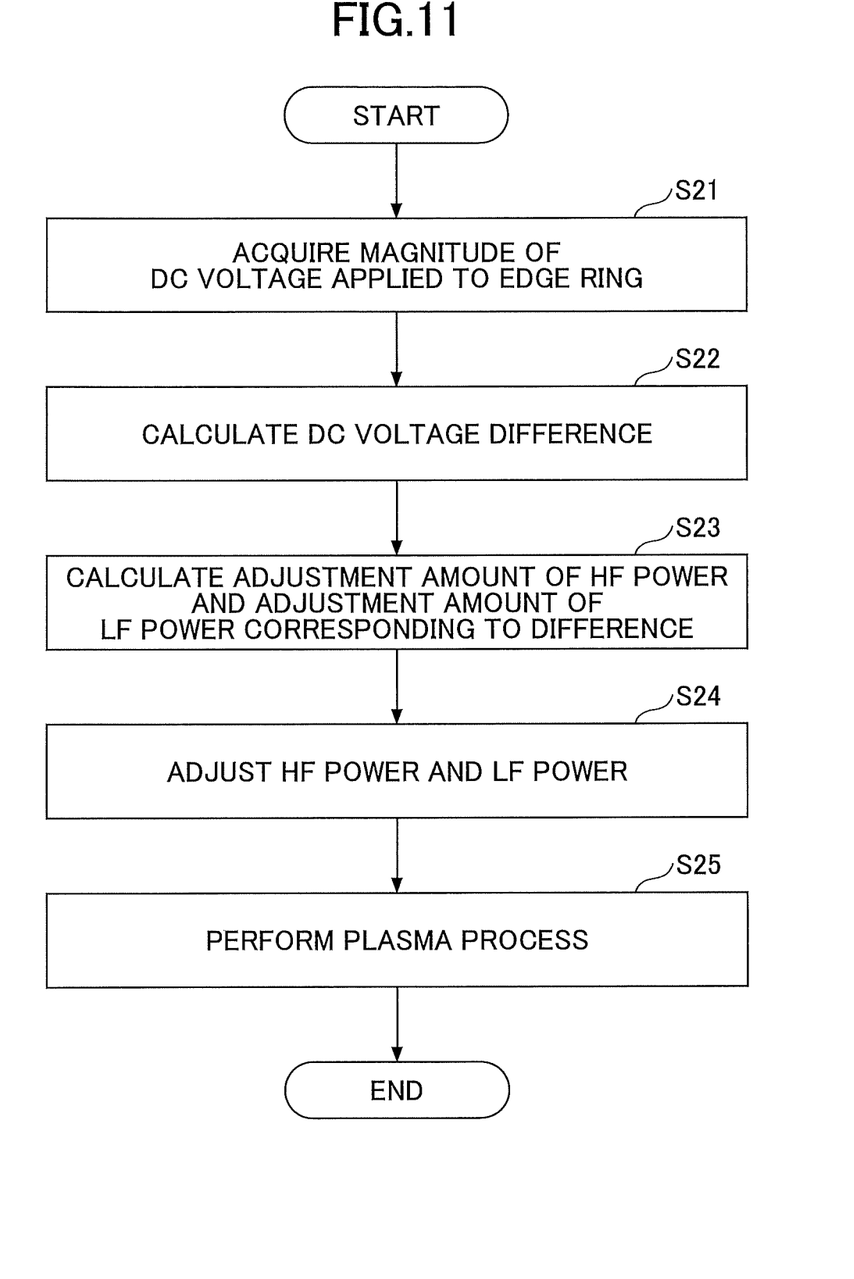
FIG. 11 is a flowchart illustrating an example of an adjusting method according to the embodiment.

Finally, a processing method and an adjustment process performed by the controller 200 according to the present embodiment will be described with reference to FIG. 10 and FIG. 11. FIG. 10 is a flowchart illustrating an example of a processing method according to the present embodiment. FIG. 11 is a flowchart illustrating an example of an adjustment process according to the present embodiment. Programs that cause the controller 200 to execute the processing method and the adjustment process are stored in the memory of the controller 200, and the programs are loaded from the memory by the CPU in the controller 200, and are executed by the CPU.

When a process illustrated in FIG. 10 is started, the voltage application control step of the edge ring is performed (step S10). As illustrated in FIG. 5, this voltage application control step determines whether DC voltage is applied to the edge ring 24 based on the current value i (i.e., a status of deposits on the edge ring 24), and controls timing of applying DC voltage. At this time, in the determination of step S15 in FIG. 5 that determines whether or not the process of FIG. 5 (voltage application control step) is terminated, the controller 200 determines that the process of FIG. 5 is terminated if it is determined that DC voltage is applied to the edge ring 24.

When the voltage application control step in FIG. 5 is completed, the process reverts to FIG. 10, and an adjustment step is executed (step S20). An example of the adjustment step will be described with reference to FIG. 11. When the adjustment step is started, the controller 200 acquires (measures) magnitude of DC voltage applied to the edge ring 24 (step S21). In the following description, the magnitude of DC voltage applied to the edge ring 24 that is measured in step S21 may also be referred to as a "DC voltage value". Next, in step S22, the controller 200 calculates a difference between a DC voltage value measured in the current processing (this time) and a DC voltage value measured in the previous processing (the last time when the present process was performed). A time interval of acquiring the DC voltage values (e.g. a period between execution of step S21 in the previous processing and execution of step S21 in the current processing) may be determined freely. Also, a difference calculated in step S22 is not limited to the difference between the DC voltage value of this time and the previous DC voltage value, but may be a difference between the DC voltage value of this time and a DC voltage value obtained at a time before last. For example, a difference between the current DC voltage and an average of the previous DC voltage value and the DC voltage value obtained at a time before last may be used.

Next, in step S23, the controller 200 calculates adjustment amounts of HF power and LF power corresponding to the difference in the DC voltage value calculated in step S22, by referring to correlation information of a difference in the DC voltage applied to the edge ring 24 and the adjustment amounts of HF power and LF power. As described with reference to FIG. 9B, the correlation information is stored in the memory in advance. The correlation information illustrated in FIG. 9B is an example of information indicating a correlation between DC voltage applied to the edge ring 24 and an adjustment amount of the process parameter, and is not limited thereto. The correlation information may be information indicating a correlation between an adjustment amount of the process parameter and a difference in DC voltage values (difference between the current DC voltage value and the previous DC voltage value), or may be information indicating a correlation between a DC voltage value and the adjustment amount of the process parameter. In the latter case, step S22 may not be performed, and an adjustment amount of HF power and an adjustment amount of LF power corresponding to the DC voltage value acquired in step S21 may be calculated in step S23, by referring to the correlation information stored in the memory.

Next, the controller 200 adjusts a value of HF power set in the recipe by using the adjustment amount of the HF power calculated in step S23, and determines the adjusted value of HF power as HF power after adjustment (step S24). Also, in step S24, the controller 200 adjusts a value of LF power set in the recipe by using the adjustment amount of the LF power calculated in step S23, and determines the adjusted value of LF power as LF power after adjustment.

Next, the controller 200 causes a plasma process to execute in the plasma processing apparatus 1 (step S25). When executing the plasma process, the controller 200 causes the HF power after adjustment determined in step S24 to be applied to the plasma processing apparatus 1, and causes the LF power after adjustment determined in step S24 to be applied to the plasma processing apparatus 1. With respect to the other process conditions, the controller 200 sets the other process conditions to setting values stored in the recipe. After the plasma process is finished, the adjustment step terminates, and the process reverts to the process flow in FIG. 10 to terminate the process.

As described above, according to the adjustment step of the present embodiment, abrasion of the edge ring 24 can be suppressed by intermittently controlling timings of applying the DC voltage to the edge ring 24. In addition, when DC voltage is applied to the edge ring 24, increase in etch rate of a central portion of a wafer W can be suppressed by adjusting a process parameter (such as HF power) in accordance with the applied DC voltage. Thus, while suppressing abrasion of the edge ring 24 and increase in etch rate at the center of the wafer W, suppression of tilting of an edge portion of the wafer W and removal of deposits on the edge ring 24 can be achieved by applying DC voltage to the edge ring 24.

Particularly, in cryogenic etching, in which etching is performed by controlling a temperature of the stage 16 within, for example, a subzero temperature range of approximately −200° C. to −10° C., a deposition amount of byproducts produced by the etching increases. Therefore, the processing method according to the present embodiment can be used as a more effective technique in cryogenic etching. However, the processing method according to the embodiment is not limited to cryogenic etching.

The processing method and the plasma processing apparatus according to the embodiment disclosed herein are to be considered exemplary in all respects and not limiting. The above embodiment may be modified and enhanced in various forms, without departing from the appended claims and spirit thereof. Matters described in the above embodiment may take other configurations to an extent not inconsistent, and may be combined to an extent not inconsistent.

Voltage applied to the edge ring 24 is not limited to DC voltage, but may be an alternating current (AC) voltage. In a case in which AC voltage is applied to the edge ring 24, an AC power supply is connected via a matching device and a blocking capacitor, instead of the first variable power supply 55. The AC power supply outputs AC power having a frequency f at which ions in the plasma can follow, i.e., a radio frequency lower than an ion plasma frequency, and is configured to change its power, a voltage peak value, or a voltage effective value. When AC voltage from the AC power supply is applied to the edge ring 24 via the blocking capacitor during an etching process, self-bias voltage occurs at the edge ring 24. That is, a negative DC voltage component is applied to the edge ring 24.

In the embodiments of the present disclosure, examples of an etching process have been described, but application of the present invention is not limited to etching processes. In the present embodiment, a step of forming a deposition film on a substrate during an etching process has been described, but a similar effect can be obtained in other processes of forming a deposition film on a processing substrate, such as Chemical Vapor Deposition (CVD) or Physical Vapor Deposition (PVD).

The present disclosure has described a case in which a process gas containing carbon is used in the deposition step, but is not limited thereto. For example, when using a plasma of a process gas capable of generating a precursor causing deposition easily, such as TEOS gas used in CVD, deposition occurs on the edge ring similarly. Further, PVD, in which a precursor generated from a target, by plasma sputtering, is deposited on a processing substrate, also deposits the precursor on the edge ring. That is, in a case in which a precursor is present in the plasma space, the precursor is also deposited on the edge ring. In these processes, deposition on the edge ring can be prevented by applying voltage to the edge ring. In addition, abrasion of the edge ring can be minimized by observing a state of a deposited film and adjusting the applied voltage.

The plasma processing apparatus of the present disclosure is applicable to any type of plasma processing apparatus, including a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus.

In the present specification, a wafer W has been referred to an example of an object to be processed. However, the object may not be limited thereto, but may be a various types of substrates used in a flat panel display (FPD), a printed circuit board, or the like.

What is claimed is:

1. A method of processing an object using a plasma processing apparatus including a stage on which the object is placed in a chamber, an outer peripheral member disposed around the stage, and a first power supply configured to apply voltage to the outer peripheral member, the method comprising:
    exposing the object to a plasma containing a precursor having a deposition property, while applying voltage from the first power supply to the outer peripheral member;
    wherein the applying voltage includes
        monitoring a status of a deposition film deposited on the outer peripheral member, the deposition film containing carbon; and
        controlling the voltage applied to the outer peripheral member based on the monitored status of the deposition film, and
    wherein, in the controlling, the voltage is applied to the outer peripheral member in response to the monitored status exceeding a predetermined threshold, said predetermined threshold being determined based on correlation data between amounts of the deposition film on the outer peripheral member and magnitudes of current that are caused by the voltage applied by the first power supply.

2. The method according to claim 1, the plasma processing apparatus further including a memory storing information about a relationship between the voltage applied to the outer peripheral member and an adjustment amount of a process parameter, and the method further comprising:
    adjusting the process parameter based on the voltage applied to the outer peripheral member, by referring to the information stored in the memory; and
    performing a plasma process under a process condition including the adjusted process parameter.

3. The method according to claim 2, wherein the process parameter is a process condition that affects density of plasma to be generated.

4. The method according to claim 2, wherein the process parameter is a process condition that affects an etch rate.

5. The method according to claim 2, wherein the process parameter is at least one of
    radio frequency power of a first frequency applied from a first radio frequency power supply,
    radio frequency power of a second frequency lower than the first frequency that is applied from a second radio frequency power supply,
    a gas supplied to the chamber,
    pressure in the chamber, and
    voltage applied from a second power supply to an upper electrode facing the stage.

6. The method according to claim 1, wherein, in the controlling, the voltage applied to the outer peripheral member is set to zero in response to the monitored status being equal to or smaller than the predetermined threshold.

7. The method according to claim 1, wherein the plasma containing the precursor having the deposition property is generated from a process gas capable of generating the precursor having the deposition property.

8. The method according to claim 7, wherein the process gas contains carbon.

\* \* \* \* \*